(12) United States Patent
Mutsuura

(10) Patent No.: US 9,806,596 B2
(45) Date of Patent: Oct. 31, 2017

(54) CONTROL BOARD FOR POWER CONVERSION DEVICE

(71) Applicant: AISIN AW CO., LTD., Anjo-shi, Aichi-ken (JP)

(72) Inventor: Keita Mutsuura, Miyoshi (JP)

(73) Assignee: AISIN AW CO., LTD., Anjo (JP)

( * ) Notice: Subject to any disclaimer, the term of this patent is extended or adjusted under 35 U.S.C. 154(b) by 0 days.

(21) Appl. No.: 15/322,926

(22) PCT Filed: Jul. 1, 2015

(86) PCT No.: PCT/JP2015/069036
§ 371 (c)(1),
(2) Date: Dec. 29, 2016

(87) PCT Pub. No.: WO2016/017363
PCT Pub. Date: Feb. 4, 2016

(65) Prior Publication Data
US 2017/0141674 A1 May 18, 2017

(30) Foreign Application Priority Data

Jul. 30, 2014 (JP) ................................. 2014-154635

(51) Int. Cl.
*H02M 1/08* (2006.01)
*H02M 7/00* (2006.01)
(Continued)

(52) U.S. Cl.
CPC .............. *H02M 1/08* (2013.01); *G01K 13/00* (2013.01); *H02M 7/003* (2013.01); *H02M 7/537* (2013.01);
(Continued)

(58) Field of Classification Search
CPC .......... H02M 1/08; H02M 1/32; H02M 7/003; H02M 7/537; H02M 2001/0003;
(Continued)

(56) References Cited

U.S. PATENT DOCUMENTS 7,341,052 B2   3/2008  Kawakita
8,736,234 B2 *  5/2014 Nakajima ............... H02P 9/107
                                                              322/33
(Continued)

FOREIGN PATENT DOCUMENTS

JP   2004-108825 A   4/2004
JP   2004-212284 A   7/2004
(Continued)

OTHER PUBLICATIONS

Sep. 29, 2015 International Search Report issued in International Patent Application No. PCT/JP2015/069036.

*Primary Examiner* — Matthew Nguyen
(74) *Attorney, Agent, or Firm* — Oliff PLC

(57) ABSTRACT

A control board where the ground potential includes a first conductor extending from the ground terminal of the power source generator to a first branch, a second conductor branching at the first branch, extending to the temperature detector, and electrically connected to only the temperature detector on a downstream side of the first branch, and a third conductor branching in a direction not directed to the second conductor at the first branch and extending to the drive.

3 Claims, 4 Drawing Sheets

(51) Int. Cl.
*H02M 7/537* (2006.01)
*H05K 1/18* (2006.01)
*H05K 1/02* (2006.01)
*H02P 29/68* (2016.01)
*G01K 13/00* (2006.01)
*H02M 1/00* (2006.01)

(52) U.S. Cl.
CPC ........... *H02P 29/68* (2016.02); *H05K 1/0213* (2013.01); *H05K 1/181* (2013.01); *H02M 2001/0003* (2013.01); *H05K 2201/10151* (2013.01)

(58) Field of Classification Search
CPC ...... H05K 1/0218; H05K 1/181; H02P 29/68; G01K 13/00
See application file for complete search history.

(56) References Cited

U.S. PATENT DOCUMENTS

| | | |
|---|---|---|
| 2007/0030311 A1 | 2/2007 | Tsujimoto |
| 2013/0322487 A1 | 12/2013 | Watanabe et al. |
| 2014/0092655 A1* | 4/2014 | Igarashi ................. B60L 3/003 363/56.03 |
| 2017/0197566 A1* | 7/2017 | Nakamura .............. B60R 16/03 |
| 2017/0201050 A1* | 7/2017 | Akita ................ H01R 13/7137 |

FOREIGN PATENT DOCUMENTS

| | | |
|---|---|---|
| JP | 2006-299988 A | 11/2006 |
| JP | 2007-038493 A | 2/2007 |
| JP | 2009-105178 A | 5/2009 |
| JP | 2013-250175 A | 12/2013 |

* cited by examiner

CONTROL BOARD FOR POWER CONVERSION DEVICE

BACKGROUND

The present disclosure relates to a control board for a power conversion device.

There is a known ignition device for internal combustion engines in which a chip of a switch IC (Integrated Circuit) including a temperature sensor and a chip of a control circuit IC are formed separately from each other and the switch IC is connected to the control circuit IC via a bonding wire (see JP-A-2006-299988, for example). In the ignition device for internal combustion engines, the control circuit IC is mounted on the GND terminal via a conductive material.

SUMMARY

By the way, a temperature detection portion may be provided on the board to detect the temperature of a switching element. The board may be provided with other circuit portions requiring the ground, such as a driving portion or an overcurrent detection portion, in addition to the temperature detection portion. In such a case, depending on an aspect of an electric connection between the temperature detection portion and other circuit portions and the ground, the detection accuracy of the temperature detection portion may be degraded by fluctuations (deviation from 0 V) of the ground potential caused by the operation of other circuit portions.

An exemplary aspect of the disclosure provides a control board for a power conversion device that can reduce degradation in the detection accuracy of the temperature detection portion.

According to an exemplary aspect of the disclosure, there is provided a control board for a power conversion device, the control board including: a board body; a power source generator provided on the board body, the power source generator having a ground terminal; a temperature detector provided on the board body, the temperature detector detecting a temperature of a switching element of the power conversion device; a drive provided on the board body, the drive generating a driving signal driving the switching element; and a ground potential provided on the board body, wherein the ground potential includes a first conductor extending from the ground terminal of the power source generator to a first branch, a second conductor branching at the first branch, extending to the temperature detector, and electrically connected to only the temperature detector on a downstream side of the first branch, and a third conductor branching in a direction not directed to the second conductor at the first branch and extending to the drive.

According to the disclosure, a control board for a power conversion device that can reduce degradation in the detection accuracy of the temperature detector can be obtained.

BRIEF DESCRIPTION OF THE DRAWINGS

Various exemplary aspects of the disclosure will be described with reference to the drawings, wherein.

DETAILED DESCRIPTION OF EMBODIMENTS

Figure 1:
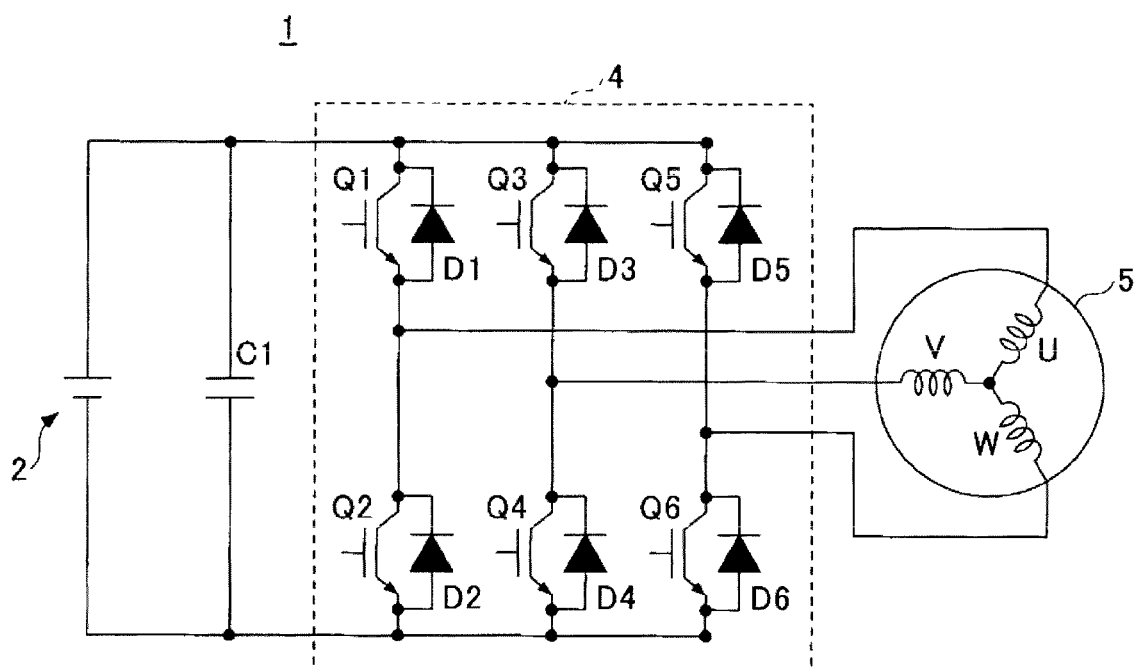
FIG. 1 illustrates an example of an electric circuit including an inverter.

FIG. 1 illustrates an example of the electric circuit 1 including the inverter 4 in an example. The electric circuit 1 is used to, for example, drive a motor.

The electric circuit 1 includes a battery 2, the inverter (an example of a power conversion device) 4, and a smoothing capacitor C1. A motor 5 is connected to the inverter 4. The motor 5 may be a travelling motor used in a hybrid vehicle or electric vehicle.

The inverter 4 includes a plurality of switching elements Q1 to Q6. The switching elements Q1 to Q6 are IGBTs (Insulated Gate Bipolar Transistor). However, other switching elements such as MOSFETs (Metal Oxide Semiconductor Field-Effect Transistor) may be used instead of IGBTs. The inverter 4 may have freewheel diodes D1 to D6 in parallel to the switching elements Q1 to Q6, respectively.

Figure 2:
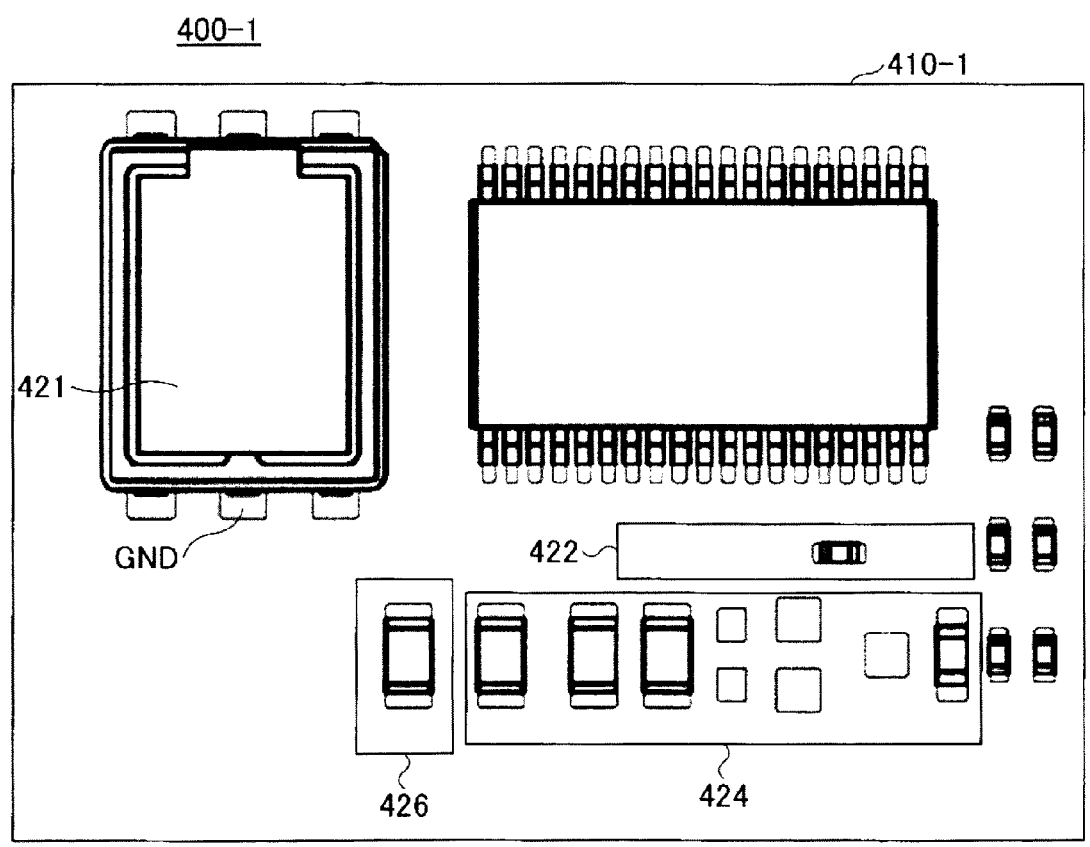
FIG. 2 is a mounting diagram illustrating a control board for the inverter in the example.
Figure 3:
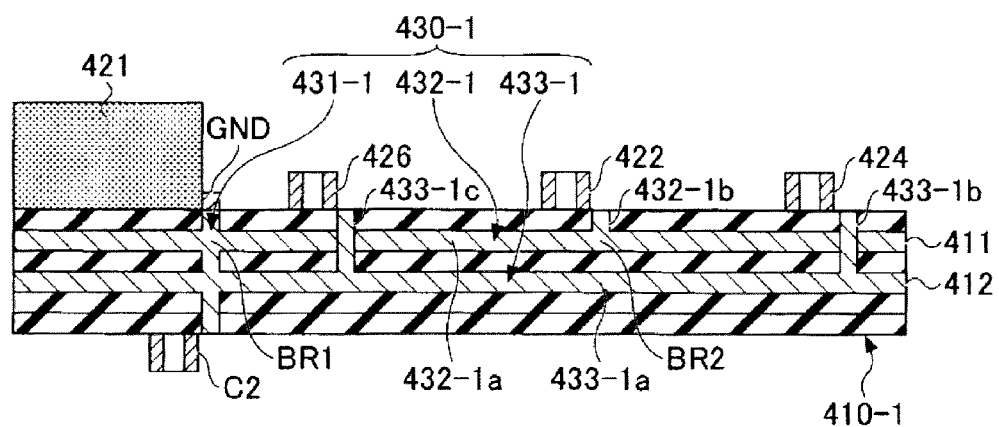
FIG. 3 illustrates a ground potential portion of the control board in the example.

FIG. 2 is a mounting diagram illustrating the control board 400-1 for the inverter 4 in the example. FIG. 3 illustrates the ground potential portion 430-1 of the control board 400-1 in the example and a cross sectional view schematically illustrating internal layers of the control board 400-1. The positions of components in FIG. 3 are slightly different from those in the mounting diagram of the control board 400-1 illustrated in FIG. 2, but the difference is not essential.

The control board 400-1 includes the board body 410-1, a power source generation portion 421 (power source generator), a temperature detection portion 422 (temperature detector), a driving portion 424 (drive), an overcurrent detection portion 426, and the ground potential portion 430-1 (ground potential).

The board body 410-1 is a multilayer board. The board body 410-1 includes, for example, two or more internal layers.

The power source generation portion 421 is provided on the board body 410-1. The power source generation portion 421 generates a power source required for the operation of the temperature detection portion 422, the driving portion 424, the overcurrent detection portion 426, and the like. The power source generation portion 421 includes a ground terminal GND. The power source generation portion 421 may be formed as a chip as illustrated in FIG. 2. The power source generation portion 421 may include a capacitor C2 as illustrated in FIG. 3.

The temperature detection portion 422 is provided on the board body 410-1. The temperature detection portion 422 detects the temperatures of the switching elements Q1 to Q6 of the inverter 4. The temperature detection portion 422 includes a plurality of polysilicon diodes connected, for example, in series. In this case, the temperature detection portion 422 detects the temperatures of the switching element Q1 and the like using the fact that the forward direction voltage of polysilicon diodes fluctuates depending on the temperatures of the switching element Q1 and the like.

The driving portion 424 is provided on the board body 410-1. The driving portion 424 generates driving signals (gate signals) for driving the switching elements Q1 to Q6. The method for driving the switching elements Q1 to Q6 is arbitrary.

The overcurrent detection portion 426 is provided on the board body 410-1. The overcurrent detection portion 426 detects overcurrents generated in the switching elements Q1 to Q6.

The ground potential portion 430-1 is provided in the board body 410-1. In the example illustrated in FIG. 3, the ground potential portion 430-1 is formed in an internal layer of the board body 410-1.

The ground potential portion 430-1 includes a first conductor portion 431-1 (first conductor), a second conductor portion 432-1 (second conductor), and a third conductor portion 433-1 (third conductor).

The first conductor portion 431-1 extends from the ground terminal GND of the power source generation portion 421 to a first branch portion BR1 (first branch). A branch portion is a point at which a current route branches to individual components. Accordingly, the point (for example, position BR2 in FIG. 3) at which one branch route is not electrically connected to any component is not a branch portion. Preferably, the length of the first conductor portion 431-1 is made as short as possible. In the example illustrated in FIG. 3, the first conductor portion 431-1 is formed by a part of a through via formed in the board body 410-1. In the following descriptions, an upstream side means the part close to the ground terminal GND of the power source generation portion 421 and a downstream side means the part away from the ground terminal GND of the power source generation portion 421.

The second conductor portion 432-1 branches at the first branch portion BR1 and extends to the temperature detection portion 422. In the example illustrated in FIG. 3, the second conductor portion 432-1 includes a conductor pattern 432-1a and a via 432-1b. The conductor pattern 432-1a is formed on a first layer 411, which is an internal layer of the board body 410-1. The conductor pattern 432-1a may be, for example, a solid pattern of copper. The via 432-1b electrically connects the conductor pattern 432-1a to the temperature detection portion 422. On the downstream side of the first branch portion BR1, the second conductor portion 432-1 is electrically connected to only the temperature detection portion 422.

The third conductor portion 433-1 branches in the direction not directed to the second conductor portion 432-1 at the first branch portion BR1 and extends to the driving portion 424. When branching in the direction not directed to the second conductor portion 432-1, there is no common current route between the third conductor portion 433-1 and the second conductor portion 432-1. In other words, the branch portion BR1 forms a branch portion from the first conductor portion 431-1 to the second conductor portion 432-1 or the third conductor portion 433-1. In the example illustrated in FIG. 3, the third conductor portion 433-1 includes the conductor pattern 433-1a and vias 433-1b and 433-1c. The conductor pattern 433-1a is formed on a second layer 412, which is an internal layer of the board body 410-1. The conductor pattern 433-1a may be, for example, a solid pattern of copper. The positions (located from the top) in the board body of the conductor pattern 433-1a and the conductor pattern 432-1a are arbitrary. The via 433-1b electrically connects the conductor pattern 433-1a to the driving portion 424. The via 433-1c electrically connects the conductor pattern 433-1a to the overcurrent detection portion 426. The vias 433-1b and 433-1c are electrically insulated from the conductor pattern 432-1a.

Figure 4:
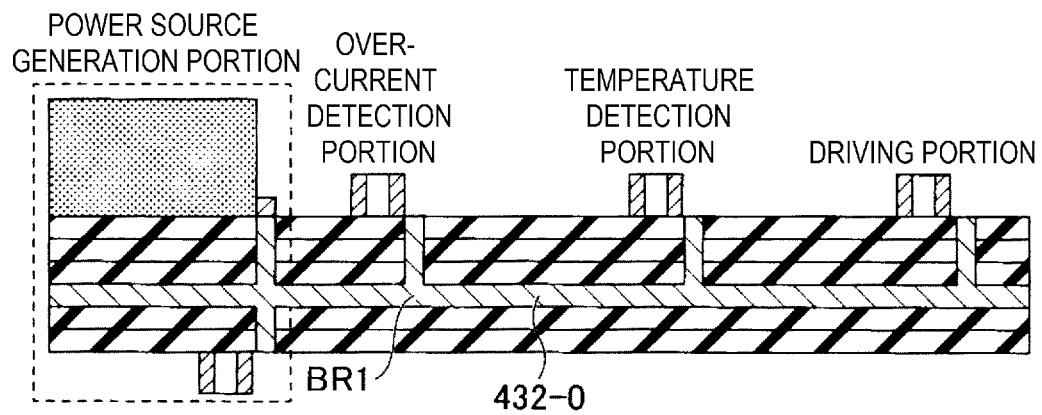
FIG. 4 schematically illustrates the ground potential portion of the control board in a comparative example.

FIG. 4 is a cross sectional view illustrating a comparative example. In the comparative example, the overcurrent detection portion, the temperature detection portion, and the driving portion (sequentially from the upstream side) are electrically connected to the solid pattern (the ground potential portion) of the internal layer of the board body. In such a comparative example, since the driving portion in addition to the temperature detection portion is electrically connected to the ground potential portion on the downstream side of the first branch portion BR1, a slight electric potential difference is caused in a conductor portion 432-0 by the operation of the driving portion. Since this electric potential difference causes fluctuations (deviation from 0 V) of the ground potential in the temperature detection portion, the detection accuracy of the temperature detection portion may be degraded. Similarly, such a problem also occurs when the positions of the overcurrent detection portion and the driving portion are exchanged in FIG. 4.

To address such a problem, in the example illustrated in FIG. 3, on the downstream side of the first branch portion BR1, the temperature detection portion 422 is electrically connected to the ground terminal GND of the power source generation portion 421 via the second conductor portion 432-1. In addition, on the downstream side of the first branch portion BR1, the driving portion 424 and the overcurrent detection portion 426 are electrically connected to the ground terminal GND of the power source generation portion 421 via the third conductor portion 433-1. Accordingly, in the example illustrated in FIG. 3, even when fluctuations of the ground electric potential in the third conductor portion 433-1 are caused by the operation of the driving portion 424 or the like, only the fluctuations in the first conductor portion 431-1 of such fluctuations affect the ground potential in the temperature detection portion 422. This can reduce degradation in the detection accuracy of the temperature detection portion 422.

In addition, in the example illustrated in FIG. 3, the second conductor portion 432-1 is electrically connected to only the temperature detection portion 422 on the downstream side of the first branch portion BR1. Accordingly, in the example illustrated in FIG. 3, only the temperature detection portion 422 is electrically connected to the second conductor portion 432-1 on the downstream side of the first branch portion BR1. Accordingly, on the downstream side of the branch portion BR1, components other than the temperature detection portion 422 do not cause fluctuations of the ground potential in the second conductor portion 432-1. This can reduce degradation in the detection accuracy of the temperature detection portion 422.

In addition, in the example illustrated in FIG. 3, since the conductor pattern 432-1a and the conductor pattern 433-1a are formed on internal layers of the board body 410-1, no restrictions are imposed on the component mounting range on the surface of the board body 410-1, and the ground potential portion 430-1 can be achieved without enlarging the board body 410-1.

Figure 5:
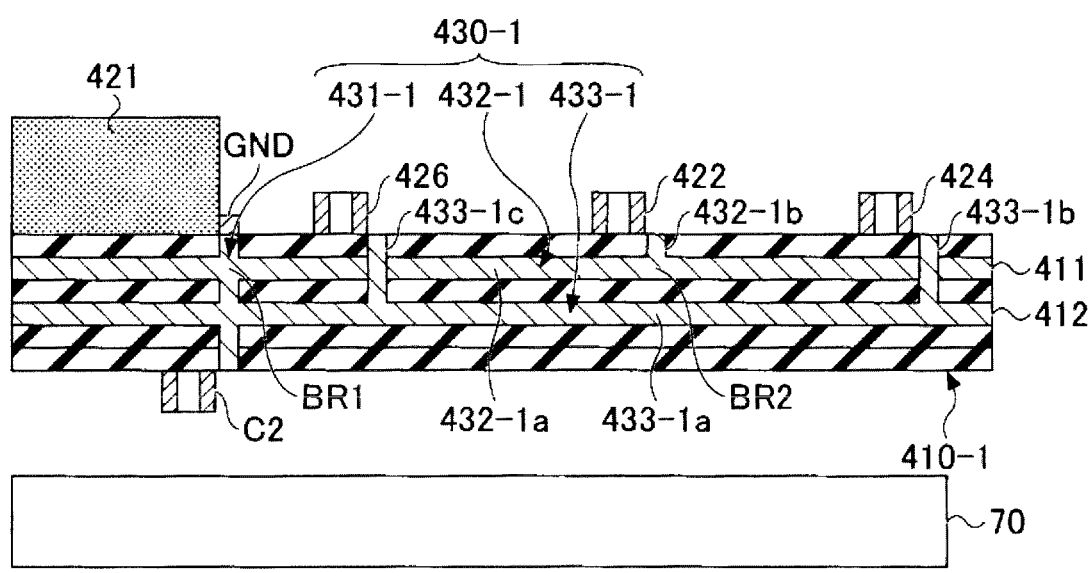
FIG. 5 is a cross sectional view schematically illustrating an example of the relationship between a power module and the board body in a mounting state.

FIG. 5 is a cross sectional view schematically illustrating an example of the relationship between the power module 70 and the board body 410-1 in the mounting state.

The board body 410-1 is preferably disposed so as to face the power module 70. The disposition so as to face the power module 70 means that the board body 410-1 and the power module 70 are arranged in the direction orthogonal to the surface of the board body 410-1 so as to be superimposed on each other in plan view. As illustrated in FIG. 5, the temperature detection portion 422 is provided on the surface of the board body 410-2 opposite to the surface of the board body 410-1 facing the power module 70. This can reduce effects of switching noise from the power module 70 on the temperature detection portion 422. The power module 70 includes the switching elements Q1 to Q6. For example, in the power module 70, the switching elements Q1 to Q6, terminals, the cooling structure, and the like may be integrally formed.

In addition, as illustrated in FIG. 5, the conductor pattern 432-1a is preferably formed on the internal layer farthest from the power module 70 in the direction orthogonal to the surface of the board body 410-1. This can reduce effects of switching noise from the power module 70 on the conductor pattern 432-1a (eventually the temperature detection portion 422). In addition, in the example illustrated in FIG. 5, since the conductor pattern 433-1a has the function of shielding switching noise, effects of switching noise from the power module 70 on the conductor pattern 432-1a (eventually the temperature detection portion 422) can be further reduced.

Figure 6:
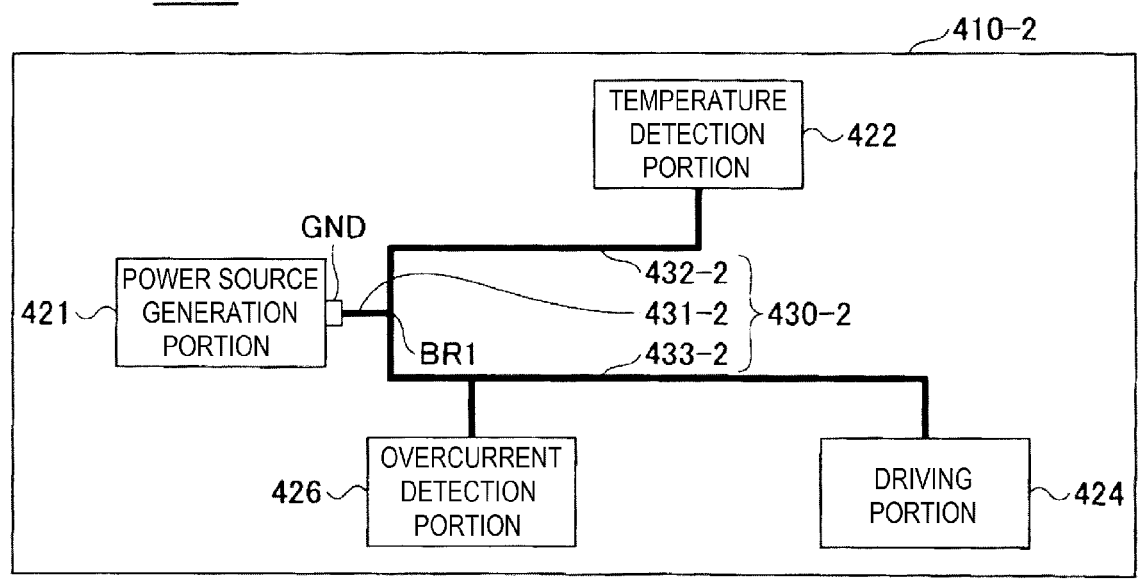
FIG. 6 schematically illustrates a ground potential portion of the control board in another example.

FIG. 6 schematically illustrates the ground potential portion 430-2 of the control board 400-2 in another example and is a plan view illustrating the board body 410-2. The control board 400-2 illustrated in FIG. 6 is different from the control board 400-1 illustrated in FIG. 3 mainly in that the board body 410-2 is not a multilayer board. Of components of the control board 400-2, components substantially the same as those in the control board 400-1 are given the same reference numerals and descriptions are omitted.

The board body 410-2 is formed by, for example, a printed circuit board. The ground potential portion 430-2 is provided in the board body 410-2. In the example illustrated in FIG. 6, the ground potential portion 430-2 is formed on the surface of the board body 410-2. The ground potential portion 430-2 may be formed by a pattern of printed wiring.

The ground potential portion 430-2 includes a first conductor portion 431-2, a second conductor portion 432-2, and a third conductor portion 433-2. Similarly, the first conductor portion 431-2 extends from the ground terminal GND of the power source generation portion 421 to the first branch portion BR1. The second conductor portion 432-2 branches at the first branch portion BR1 and extends to the temperature detection portion 422. On the downstream side of the first branch portion BR1, the second conductor portion 432-2 is electrically connected to only the temperature detection portion 422. The third conductor portion 433-2 branches at the first branch portion BR1 in the direction not directed to the second conductor portion 432-2 and extends to the driving portion 424. The third conductor portion 433-2 is electrically connected to the overcurrent detection portion 426 in addition to the driving portion 424 on the downstream side of the first branch portion BR1.

Also in the example illustrated in FIG. 6, basically the same effects as in the above example illustrated in FIG. 3 can be obtained. However, in the example illustrated in FIG. 6, restrictions are imposed on the component mounting range on the surface of the board body 410-2. The control board 400-2 may also be disposed with respect to the power module 70 in an aspect as illustrated in FIG. 5. That is, the board body 410-2 is disposed so as to face the power module 70 and, at this time, the temperature detection portion 422 is provided on the surface of the board body 410-2 opposite to the surface of the board body 410-2 facing the power module 70. This can reduce effects of switching noise from the power module 70 on the temperature detection portion 422.

Although embodiments have been described above, the disclosure is not limited to a particular embodiment and may be modified or changed variously within the scope designated. In addition, all or a plurality of components in the above embodiments may be combined.

For example, although the overcurrent detection portion 426 is provided as an example of a circuit portion other than the driving portion 424 in the above embodiments, another circuit portion requiring the ground may be provided in addition to or instead of the overcurrent detection portion 426.

In addition, although the power source generation portion 421, the temperature detection portion 422, the driving portion 424, and the overcurrent detection portion 426 are provided on a single surface of the board body 410-1 (410-2) in the above embodiments, any of the power source generation portion 421, the temperature detection portion 422, the driving portion 424, and the overcurrent detection portion 426 may be provided on the opposite surface of the board body 410-1 (410-2).

Although a component for controlling the inverter 4 is mounted on the control board 400-1 (control board 400-2) in the above embodiments, the disclosure is not limited to the embodiments. For example, when a DC-DC converter (another example of the power conversion device) is provided between the smoothing capacitor C1 and the battery 2, a component for controlling the DC-DC converter may be mounted on the control board 400-1 (control board 400-2) instead of or in addition to the component for controlling the inverter 4.

In addition, although the internal layer on which the conductor pattern 433-1a is formed is different from the internal layer on which the conductor pattern 432-1a is formed in the example illustrated in FIG. 3, the conductor patterns 433-1a and 432-1a may be formed on a single internal layer.

The following examples will be further disclosed with respect to the above embodiments.

(1)

The control board 400-1 or 400-2 for the power conversion device 4 including the board body 410-1 or 410-2, the power source generation portion 421 provided on the board body 410-1 or 410-2, the power source generation portion 421 having the ground terminal GND, the temperature detection portion 422 provided on the board body 410-1 or 410-2, the temperature detection portion 422 detecting temperatures of the switching elements Q1 to Q6 of the power conversion device 4, the driving portion 424 provided on the board body 410-1 or 410-2, the driving portion 424 generating driving signals driving the switching elements Q1 to Q6, and the ground potential portion 430-1 or 430-2 provided in the board body 410-1 or 410-2, in which the ground potential portion 430-1 or 430-2 includes the first conductor portion 431-1 or 431-2 extending from the ground terminal GND of the power source generation portion 421 to the first branch portion BR1, the second conductor portion 432-1 or 432-2 branching at the first branch portion BR1, extending to the temperature detection portion 422, and electrically connected to only the temperature detection portion 422 on the downstream side of the first branch portion BR1, and the third conductor portion 433-1 or 433-2 branching in a direction not directed to the second conductor portion 432-1 or 432-2 at the first branch portion BR1 and extending to the driving portion 424.

In the structure described in (1), the temperature detection portion 422 is electrically connected to the ground terminal GND of the power source generation portion 421 via the second conductor portion 432-1 or 432-2 on the downstream side of the first branch portion BR1. In addition, the driving portion 424 is electrically connected to the ground terminal GND of the power source generation portion 421 via the third conductor portion 433-1 or 433-2 on the downstream side of the first branch portion BR1. Accordingly, even when fluctuations of the ground electric potential in the third conductor portion 433-1 are caused by the operation of the driving portion 424, only the fluctuations in the first conductor portion 431-1 or 431-2 of such fluctuations affect the ground potential in the temperature detection portion 422. This can reduce degradation in the detection accuracy of the temperature detection portion 422. In addition, the second conductor portion 432-1 or 432-2 is electrically connected to only the temperature detection portion 422 on the downstream of the first branch portion BR1. Accordingly, only the temperature detection portion 422 is electrically connected to the second conductor portion 432-1 or 432-2 on the downstream side of the first branch portion BR1. Accordingly, on the downstream side of the first branch portion BR1, components other than the temperature detection portion 422 do not cause fluctuations of the ground potential in the second conductor portion 432-1 or 432-2. This can reduce degradation in the detection accuracy of the temperature detection portion 422.

(2)

The control board 400-1 for the power conversion device 4 described in (1), in which the board body 410-1 or 410-2 is a multilayer board, the second conductor portion 432-1 or 432-2 includes the conductor pattern 432-1a formed on the first layer 411 that is an internal layer of the board body 410-1 or 410-2, and the third conductor portion 433-1 or 433-2 includes the conductor pattern 433-1a formed on the second layer 412 that is an internal layer of the board body 410-1 or 410-2, the second layer 412 being different from the first layer 411.

In the structure described in (2), the conductor pattern 432-1a and the conductor pattern 433-1a are formed on internal layers of the board body 410-1. This eliminates restrictions on the component mounting range on the surface of the board body 410-1 or 410-2 caused by the conductor pattern 432-1a and the conductor pattern 433-1a, thereby achieving the ground potential portion 430-1 without enlarging the control board 400-1.

(3)

The control board 400-1 for the power conversion device 4 described in (2), in which the board body 410-1 is disposed so as to face the power module 70 including the switching elements Q1 to Q6, the temperature detection portion 422 is provided on a surface of the board body 410-1 opposite to a surface of the board body 410-1 facing the power module 70, and the first layer 411 is an internal layer farther than the second layer 412 from the power module 70.

In the structure described in (3), effects of switching noise from the power module 70 on the temperature detection portion 422 can be reduced. In addition, effects of switching noise from the power module 70 on the conductor pattern 432-1a (eventually the temperature detection portion 422) can be reduced. In addition, since the conductor pattern 433-1a of the second layer 412 has the function of shielding switching noise, effects of switching noise from the power module 70 on the conductor pattern 432-1a (eventually the temperature detection portion 422) of the first layer 411 can be further reduced.

The present international application claims priority based on Japanese Patent Application No. 2014-154635 filed on Jul. 30, 2014, and the entire contents thereof are incorporated herein by reference.

The invention claimed is:

1. A control board for a power conversion device, the control board comprising:
   a board body;
   a power source generator provided on the board body, the power source generator having a ground terminal;
   a temperature detector provided on the board body, the temperature detector detecting a temperature of a switching element of the power conversion device;
   a drive provided on the board body, the drive generating a driving signal driving the switching element; and
   a ground potential provided on the board body,
   wherein the ground potential includes a first conductor extending from the ground terminal of the power source generator to a first branch, a second conductor branching at the first branch, extending to the temperature detector, and electrically connected to only the temperature detector on a downstream side of the first branch, and a third conductor branching in a direction not directed to the second conductor at the first branch and extending to the drive.

2. The control board for a power conversion device according to claim 1,
   wherein the board body is a multilayer board,
   the second conductor includes a conductor pattern formed on a first layer that is an internal layer of the board body, and
   the third conductor includes a conductor pattern formed on a second layer that is an internal layer of the board body, the second layer being different from the first layer.

3. The control board for a power conversion device according to claim 2,
   wherein the board body is disposed so as to face a power module including the switching element,
   the temperature detector is provided on a surface of the board body opposite to a surface of the board body facing the power module, and
   the first layer is an internal layer farther than the second layer from the power module.

* * * * *